(12) United States Patent
Takasu

(10) Patent No.: US 8,575,679 B2
(45) Date of Patent: Nov. 5, 2013

(54) NONVOLATILE SEMICONDUCTOR MEMORY DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 75 days.

(21) Appl. No.: 13/374,281

(22) Filed: Dec. 20, 2011

(65) Prior Publication Data

US 2012/0168844 A1    Jul. 5, 2012

(30) Foreign Application Priority Data

Dec. 29, 2010 (JP) ................................ 2010-294479
Dec. 29, 2010 (JP) ................................ 2010-294480
Nov. 21, 2011 (JP) ................................ 2011-254290

(51) Int. Cl.
*H01L 29/788* (2006.01)

(52) U.S. Cl.
USPC ........... 257/316; 257/314; 257/315; 257/317; 257/E29.03; 438/201; 438/211; 365/185.18; 365/185.26

(58) Field of Classification Search
USPC ............ 257/316, 314, 315, 317, 326, E29.03; 438/201, 211, 257; 365/185.18, 185.26
See application file for complete search history.

(56) References Cited

U.S. PATENT DOCUMENTS 5,801,416 A * 9/1998 Choi et al. .................... 257/335

FOREIGN PATENT DOCUMENTS

JP    01160058    6/1989

* cited by examiner

*Primary Examiner* — Thinh T Nguyen
(74) *Attorney, Agent, or Firm* — Adams & Wilks

(57) ABSTRACT

Provided is an electrically erasable and programmable nonvolatile semiconductor memory device having a tunnel region; the tunnel region and the peripheral of the tunnel region are dug down to be made lower, and a depletion electrode, to which an arbitral potential is given to deplete a part of the tunnel region through a depletion electrode insulating film, is arranged in the lowered drain region.

5 Claims, 6 Drawing Sheets

NONVOLATILE SEMICONDUCTOR MEMORY DEVICE

BACKGROUND OF THE INVENTION

1. Field of the Invention

The present invention relates to an electrically erasable and programmable nonvolatile semiconductor memory device.

2. Description of the Related Art

A basic unit of an electrically erasable and programmable nonvolatile semiconductor memory is a memory cell whose structure is as follows: an N-type source region and a N-type drain region disposed on both side of a channel region and both disposed on a P-type silicon substrate; a tunnel region disposed on a part of the drain region; a floating gate electrode formed on a tunnel insulating film formed of a thin silicon oxide film or a composite film of a silicon oxide film and a silicon nitride film having a thickness equal to or less than a hundred angstrom; and a control gate electrode formed on a control insulating film formed of a thin insulating film and having a strong capacitive coupling with the floating gate electrode. The floating gate electrode is isolated electrically from the circumference and is capable of storing electric charges inside of it.

The floating gate electrode and the control gate electrode are both extended upon the channel region, and the conductance of the channel region varies according to the potential of the floating gate electrode. Accordingly change of the electric charges in the floating gate electrode can prompt a nonvolatile memory of information. Application of a voltage of about 15 volts or more to the drain region and also to the tunnel region against the control gate electrode generates a tunnel current which ejects electrons stored in the floating gate electrode to the drain region through the tunnel insulating film formed in the tunnel region, and it is also possible to inject electrons into the floating gate electrode vice versa.

As described above change of the electric charge in the floating gate causes the functions as a nonvolatile memory. A lot of memory cells having such functions can be configured in columns and rows to form a memory array to have a large volume nonvolatile semiconductor memory device.

At this point the tunnel region having the tunnel insulating film through which electrons transport is especially important. On one hand the tunnel insulating film enables a quite lot of rewriting of memory information up to some hundred thousands times, and on the other hand it plays a dominant role against the demand for long term storage of memory information (retention of the electric charges) for a few decades.

As an improvement in reliability of the tunnel region and the tunnel insulating film, a device in which a tunnel region having a different impurity concentration is formed next to the drain region to improve the program/erase characteristic (endurance characteristic) or the retention characteristic is proposed as in, for example, Japanese Patent Publication H01-160058A.

SUMMARY OF THE INVENTION

The above-mentioned improvement of the semiconductor device in which a special tunnel region is formed independently from the drain region has problems such as an increase in the occupation area which leads to an increase in cost. No consideration was paid to the edge area of the tunnel region which gives a significant effect to the endurance characteristic and the retention characteristic.

It is an object of the present invention to provide an electrically erasable and programmable nonvolatile semiconductor memory device having a high reliability caused by suppression of degradation of the tunnel insulating film without increasing the occupation area.

In order to solve the above-mentioned problems an electrically erasable and programmable nonvolatile semiconductor memory device according to the present invention includes:

a first conductivity-type semiconductor substrate;

a second conductivity-type source region and a drain region disposed apart to face each other on a surface of the semiconductor substrate;

a channel formation region sandwiched by the source region and the drain region, formed on the surface of the semiconductor substrate;

a floating gate electrode disposed on a gate insulating film over the source region, the drain region and the channel region;

a control gate electrode disposed on a control insulating film over the floating gate electrode and capacitively coupled to the floating gate electrode;

a tunnel region disposed in a part of the drain region; and a tunnel insulating film disposed between a surface of the tunnel region and the floating gate electrode;

wherein a peripheral region around the tunnel region is made lower to arrange a depletion electrode for controlling a potential required to deplete a part of the tunnel region through a depletion electrode insulating film.

By the improvements described above, prevention of the concentration of the electric field to the edge area where defect is easy to grow, increase of the coupling ratio, and removal of the failure part are permitted in the tunnel region which gives a significant effect to the endurance characteristic and the retention characteristic; an electrically erasable and programmable nonvolatile semiconductor memory device having a high reliability realized by suppression of degradation in the tunnel insulating film can be obtained without increasing the occupation area.

DETAILED DESCRIPTION OF THE PREFERRED EMBODIMENT

Hereinafter, an electrically erasable and programmable nonvolatile semiconductor memory device according to the present invention is described with reference to the drawings for different embodiments.

1. First Embodiment

Figure 1:
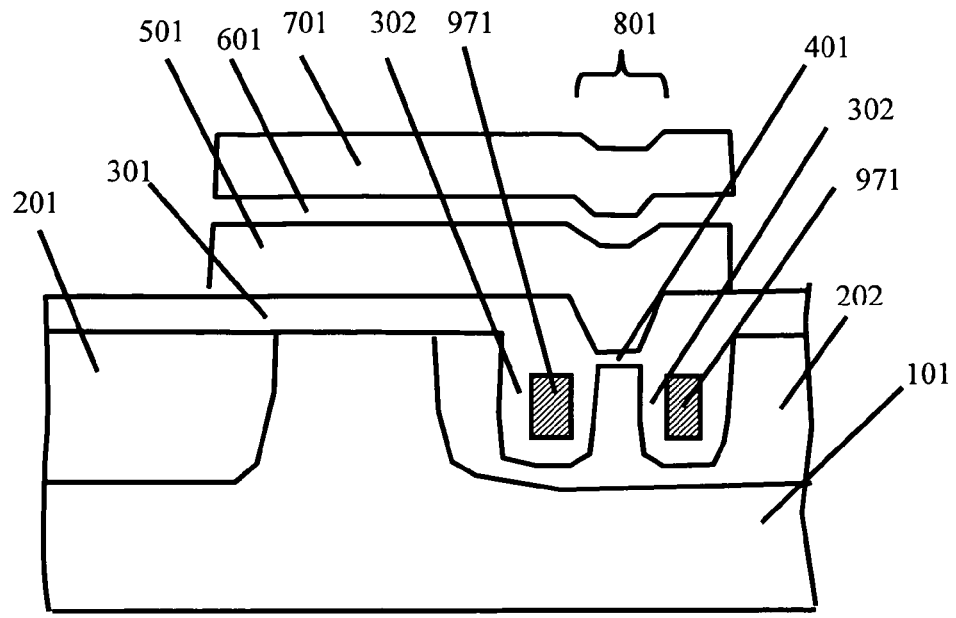
FIG. 1 shows a cross-sectional view illustrating the first embodiment of a nonvolatile semiconductor memory device according to the present invention.
Figure 2:
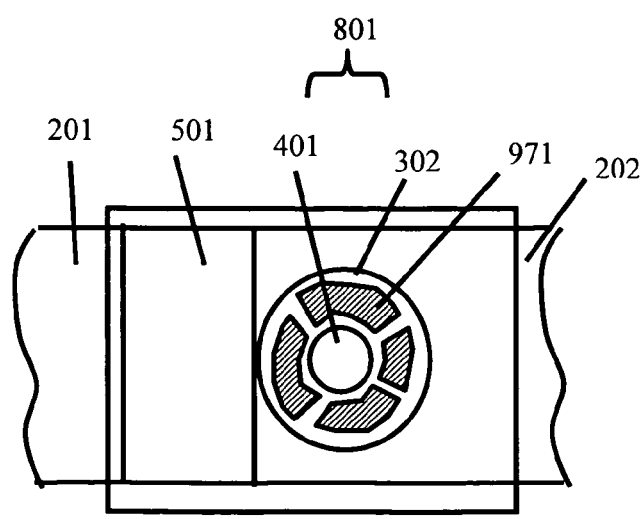
FIG. 2 shows a plan view illustrating the first embodiment of a nonvolatile semiconductor memory device according to the present invention.
Figure 3:
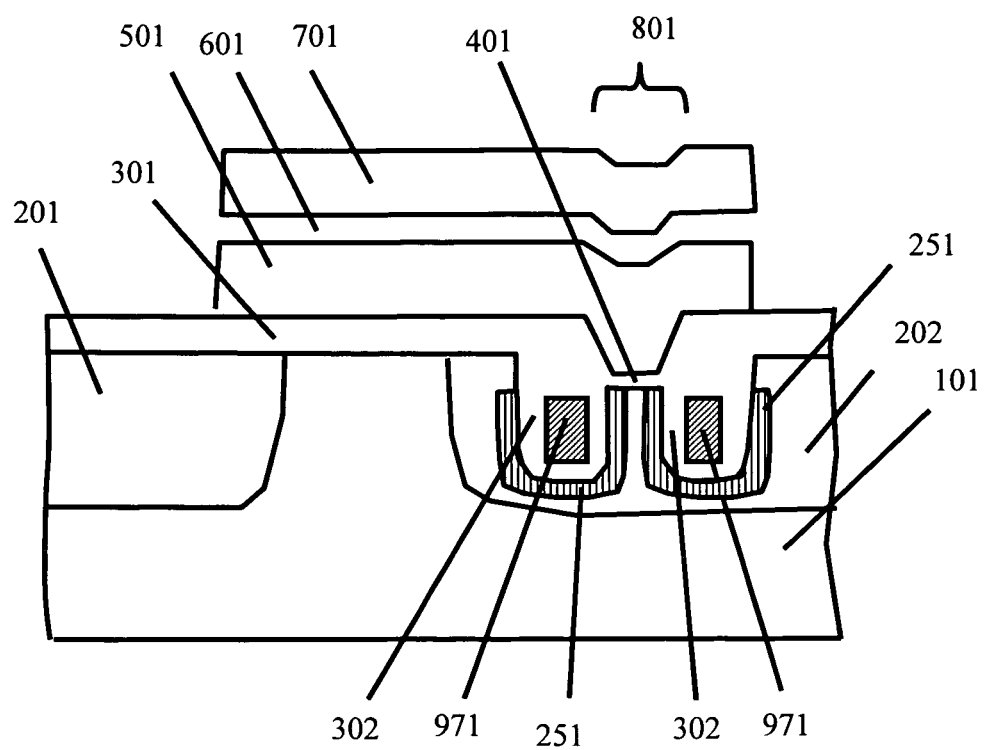
FIG. 3 shows a cross-sectional view illustrating a formation of the depletion layer in the first embodiment of a nonvolatile semiconductor memory device according to the present invention.

The first embodiment of a nonvolatile semiconductor memory device is explained with references to FIGS. 1 to 3.

FIG. 1 shows a cross-sectional view illustrating the first embodiment of a nonvolatile semiconductor memory device according to the present invention; a source region 201 and a drain region 202 of the second conductivity-type, which is N-type in this case, are formed apart to face each other on a surface of the semiconductor substrate of the first conductivity-type, which is P-type in this case, to define a channel region on the surface of the semiconductor substrate between the source region and the drain region; a floating gate electrode 501, which is formed from polycrystalline silicon or the like, is disposed on a gate insulating film 301, which is formed, for example, from silicon oxide film and having a thickness of 400 angstroms, over the source region, the drain region and the channel region; a control gate electrode 701, which is formed from polycrystalline silicon or the like, is disposed on a control insulating film, which is formed from a silicon oxide film, a silicon nitride film or a composite film of these films, over the floating gate electrode 501 to have a capacitive coupling with it. In particular the surface of the tunnel region 801 in the drain region 202 is dug into the inside of the drain region 202 to be made lower than the original surface of the drain region 202. A tunnel insulating film 401, which is formed from a silicon oxide film, a silicon nitride film, or a composite film of these films, is arranged on the surface of the tunnel region 801.

The drain region around the tunnel region is dug from the surface. A depletion electrode made from poly-crystalline silicon or the like is placed inside of the lowered drain region. An arbitral potential is given to the depletion electrode to deplete a part of the tunnel region 801 through a depletion electrode insulating film 302, which is formed from a silicon oxide film, a silicon nitride film or a composite film of these films, having a thickness thicker than that of the gate insulating film 301.

FIG. 2 shows a plan view illustrating the first embodiment of a nonvolatile semiconductor memory device according to the present invention. The first embodiment shown by FIG. 1 is viewed plainly from the upside.

As shown in FIG. 2 the depletion electrode 971 is divided into four parts, and placed around the tunnel region 801 with a depletion electrode insulating film 302 therebetween. Each of the four parts of the depletion electrode 971 has an electrical connection to be applied with a mutually independent potential though the situation is not shown in the figure. Fixation of the depletion electrode 971 at a predetermined potential enables the formation of a depletion layer by depleting the tunnel region 801 locating along the side of the depletion electrode 971. The depletion layer is also formed in the tunnel region 601 under the tunnel insulating film 401 according to an electric field generated by the applied voltage to the depletion electrode 971. The applied voltage to the divided depletion electrode 971 can control the width and the depth of the depletion layer formed in the tunnel region 801 under the tunnel insulating film 401. Although FIG. 2 shows a case in which the depletion electrode 971 is divided into four parts, the number of division is not limited to four; formation of a unified single depletion electrode or division into more parts will also be possible.

FIG. 3 shows a cross-sectional view illustrating a formation of the depletion layer in the first embodiment of a nonvolatile semiconductor memory device. A high voltage is applied to the depletion electrode 971; a depletion layer 251 is formed on the tunnel region 801 along the depletion electrode 971 and on the drain region 202. The depletion layer 251 is further formed under the tunnel insulating film 401 to narrow down the tunnel region 801.

Since the depletion layer 251 covers the edge area of the tunnel region 801 in the data rewriting operation, a strong electric field does not emerge between the floating gate electrode 501 and the drain region 202 at the edge area even a high voltage is applied between them. As a result an equivalent structure in which the thickness of the tunnel insulating film 401 is effectively increased is obtained; prevention of the concentration of the electric field at the edge area to which the stress is applied most, improvement of the reliability of the tunnel insulating film 401, and progress both in the number of data program/erase cycles and in the retention time are permitted.

Multiple arrangement of the depletion electrode 971 and assignment of independent potential to them enables arbitral control of the formation of the depletion layer 251 in the tunnel region 801, allowing reduction and arbitral placement of a tunneling area where electrons are essentially exchanged between the tunnel region 801 and the floating gate electrode 501 through the tunnel insulating film 401. Thereby not only avoiding the edge area of the tunnel region 801 as described above but also increase of the coupling ratio of the two capacitors: one formed between the floating gate electrode 501 and the control gate electrode 701, and the other formed between the floating gate electrode 501 and the drain region 202, is achieved, permitting reduction of the applied voltage needed for data rewrite operation.

In addition when a defect or the like occurs in the tunnel insulating film 401, removal of the area including the defect from the tunneling region is possible; a repairing function of the memory cell is provides.

In the embodiment shown by FIG. 3 the tunneling area is narrowed by the depletion layer 251 grown by the application of a high voltage to the depletion electrode 971 through the depletion electrode insulating film 302 from both side of the tunnel region 801. The growth of the depletion lay 251 only from one side of the tunnel region 801 is also possible by applying a high voltage to a one side of the depletion electrode 971.

As shown above application of a predetermined voltage to the depletion electrode 971 at a needed position can grow a depletion layer 251 to arbitrarily define an area and a position of the tunneling area due to a purpose such as securing a predetermined coupling ratio or avoidance of the defect area of the tunnel insulating film 401.

Manufacturing step is simple since the depletion electrode 971 and the floating gate electrode 501 are both made from poly-crystalline silicone or the like which is widely used in manufacturing of a standard semiconductor device. Since the thickness of the depletion electrode insulating film 302 formed between the depletion electrode 971 and the tunnel region 801 and between the depletion electrode 971 and the drain region 202 is thicker than that of the gate insulating film 301, the depletion electrode insulating film 302 can hold a good condition without break or degradation if the maximum apply voltage is applied between the depletion electrode 971 and one of the tunnel region 801 and the drain region 202.

At least one of the tunnel insulating film 401, the control insulating film 601, and the depletion electrode insulating film 302 is made of a composite film of a silicon oxide film and a silicon nitride film to improve reliability.

As explained above in the embodiment according to the present invention formation of the tunnel region 801, which gives a significant effect to the endurance characteristic and the retention characteristic, on a region located inside of the drain region 202 from the surface enables improvement of the film quality of the tunnel insulating film 401 formed on the surface of the tunnel region 801, prevention of concentration of the electric field to the edge area where a defect grows, increase of the coupling ratio, and removal of a defect area. An electrically erasable and programmable nonvolatile semiconductor memory device having a high reliability realized by suppression of degradation in the tunnel insulating film can be obtained without increasing the occupation area The tunnel insulating film 401 is formed on a surface dug down to an inside of the drain region 202 from the surface and made on a region inside of the semiconductor substrate having a good crystallization and few defects to avoid a surface region of the semiconductor substrate which includes many defects. Thereby reliability of the tunnel insulating film is further increased to improve the number of data program/erase cycles and the data storage time.

2. Second Embodiment

Figure 4:
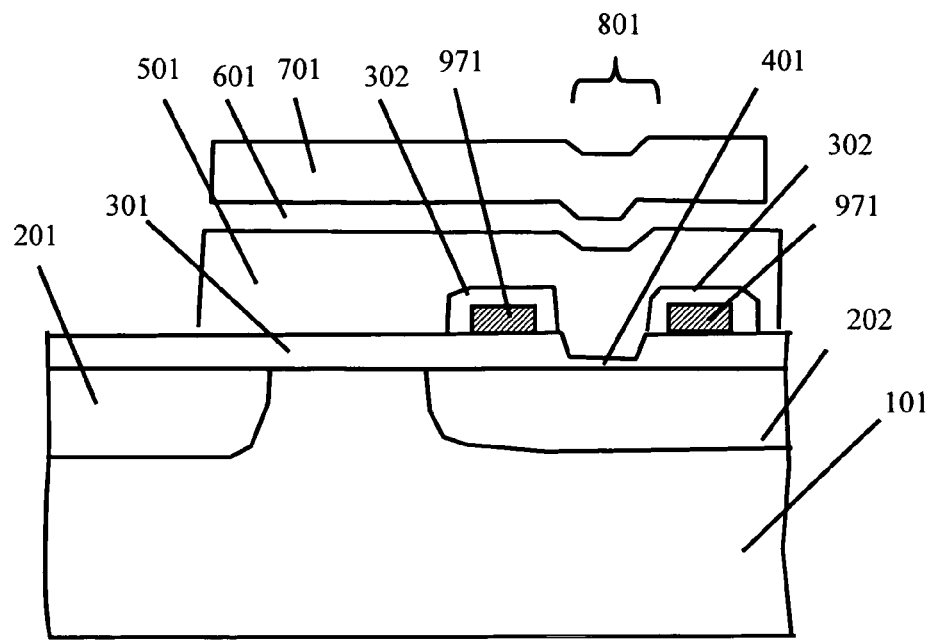
FIG. 4 shows a cross-sectional view illustrating the second embodiment of a nonvolatile semiconductor memory device according to the present invention.
Figure 5:
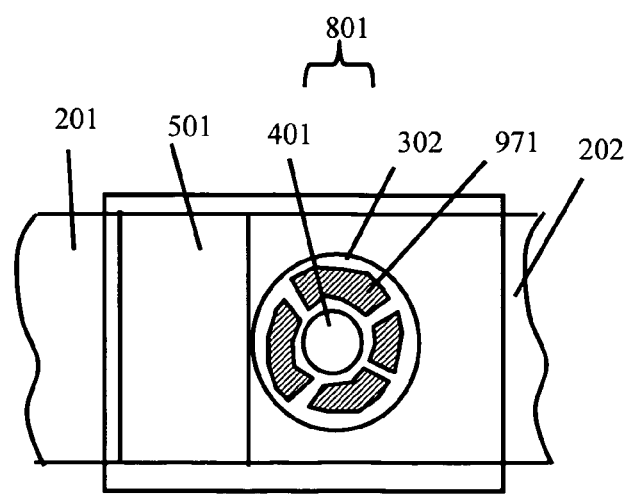
FIG. 5 shows a plan view illustrating the second embodiment of a nonvolatile semiconductor memory device according to the present invention.
Figure 6:
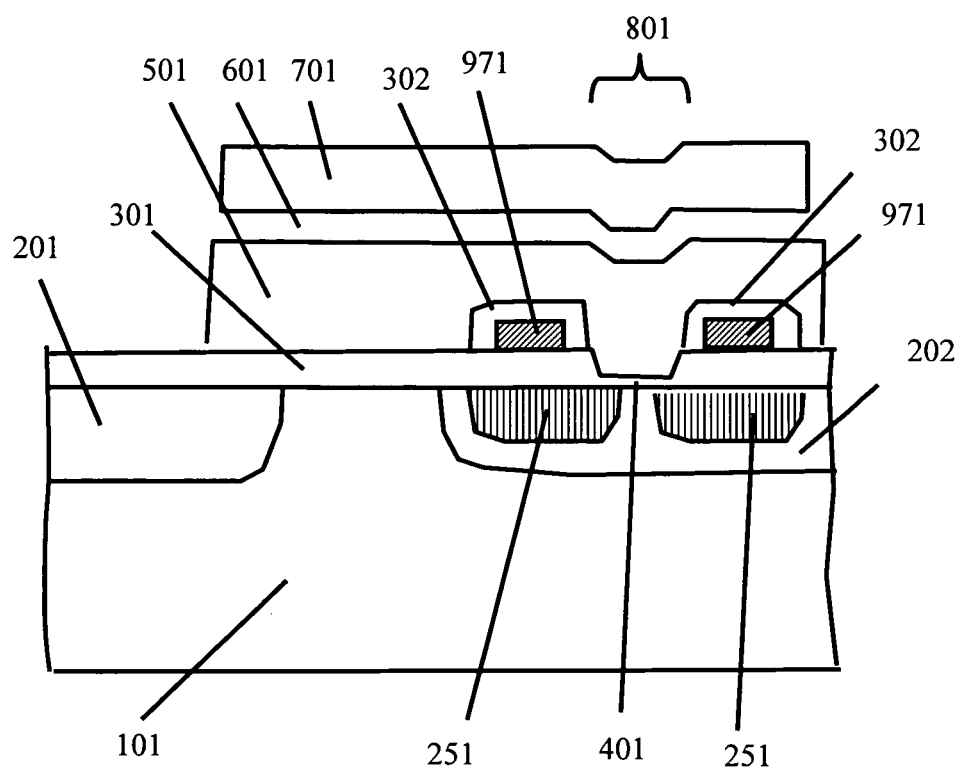
FIG. 6 shows a cross-sectional view illustrating a formation of the depletion layer in the second embodiment of a nonvolatile semiconductor memory device according to the present invention.

The Second embodiment of a nonvolatile semiconductor memory device is explained with references to FIGS. 4 to 6.

FIG. 4 shows a cross-sectional view illustrating the second embodiment of a nonvolatile semiconductor memory device according to the present invention; a source region 201 and a drain region 202 of the second conductivity-type, which is N-type in this case, are formed apart to face each other on a surface of the semiconductor substrate of the first conductivity-type, which is P-type in this case, to define a channel region on the surface of the semiconductor substrate between the source region and the drain region; a floating gate electrode 501, which is formed from polycrystalline silicon or the like, is disposed on a gate insulating film 301, which is formed, for example, from silicon oxide film and having a thickness of 400 angstroms, over the source region, the drain region and the channel region; a control gate electrode 701, which is formed from polycrystalline silicon or the like, is disposed on a control insulating film, which is formed from a silicon oxide film, a silicon nitride film or a composite film of these films, over the floating gate electrode 501 to have a capacitive coupling with it. A tunnel insulating film 401, which is formed from a silicon oxide film, a silicon nitride film or a composite film of these films, is arranged on the surface of the tunnel region 801.

The floating gate electrode 501 is arranged on the tunnel insulating film 401. A depletion electrode 971 made from poly-crystalline silicon or the like, to which an arbitral potential is given to deplete a part of the tunnel region 801, is placed between the gate insulating film 301 and the floating gate electrode 501 and around a part of the floating gate electrode 501 just over the tunnel insulating film 401 with a depletion electrode insulating film 302 formed therebetween, which is formed from a silicon oxide film, a silicon nitride film or a composite film of these films, having a thickness thicker than that of the gate insulating film 301.

FIG. 5 shows a plan view illustrating the second embodiment of a nonvolatile semiconductor memory device according to the present invention. The second embodiment shown by FIG. 4 is viewed plainly from the upside.

As shown in FIG. 5 the depletion electrode 971 is divided into four parts, and placed around the part of the floating gate electrode 501 just over the tunnel region 801 with a depletion electrode insulating film 302 therebetween. Each of the four parts of the depletion electrode 971 has an electrical connection to be applied with a mutually independent potential though the situation is not shown in the figure. Fixation of the depletion electrode 971 at a predetermined potential causes depletion on a surface region of the drain region 202 under the depletion electrode 971 to form a depletion layer. The depletion layer is formed even in the tunnel region 801 under the tunnel insulating film 401 according to an electric field generated by the applied voltage to the depletion electrode 971. The applied voltage to the divided depletion electrode 971 can control the width and the depth of the depletion layer formed in the drain region 202 beneath and even in the tunnel region 801 under the tunnel insulating film 401. Although FIG. 5 shows a case in which the depletion electrode 971 is divided into four parts, the number of division is not limited to four; formation of a unified single depletion electrode or division into more parts will also be possible.

FIG. 6 shows a cross-sectional view illustrating a formation of the depletion layer in the second embodiment of a nonvolatile semiconductor memory device. A high voltage is applied to the depletion electrode 971; a depletion layer 251 is formed on the surface of the drain region 202 around the tunnel insulating film 401 under the depletion electrode 971. A part of the depletion layer 251 goes around even under the tunnel insulating film 401 to narrow the tunnel region 801.

Since the depletion layer 251 covers the edge area of the tunnel region 801 in the data rewriting operation, a strong electric field does not emerge between the floating gate electrode 501 and the drain region 202 at the edge area even a high voltage is applied between them. As a result an equivalent structure in which the thickness of the tunnel insulating film 401 is effectively increased is obtained; prevention of the concentration of the electric field at the edge area, improvement of the reliability of the tunnel insulating film 401, and progress both in the number of data program/erase cycles and in the retention time are permitted.

Multiple arrangement of the depletion electrode 971 and assignment of independent potential to them enables arbitral control of the formation of the depletion layer 251 in the tunnel region 801, allowing reduction and arbitral placement of the tunneling area where electrons are essentially exchanged between the tunnel region 801 and the floating gate electrode 501 through the tunnel insulating film 401. Thereby not only avoiding the edge area of the tunnel region 801 as described above but also increase of the coupling ratio of the two capacitors: one formed between the floating gate electrode 501 and the control gate electrode 701, and the other formed between the floating gate electrode 501 and the drain region 202, is achieved, permitting reduction of the applied voltage needed for data rewrite operation.

In addition when a defect or the like occurs in the tunnel insulating film 401, removal of the area including the defect from the tunneling area is possible; a repairing function of the memory cell is provides.

In the embodiment shown by FIG. 6 the tunneling area is narrowed by the depletion layer 251 grown by the application of a high voltage to the depletion electrode 971 from both side of the tunnel region 801. The growth of the depletion lay 251 only from one side of the tunnel region 801 is also possible by applying a high voltage to a one side of the depletion electrode 971.

As shown above application of a predetermined voltage to the depletion electrode 971 at a needed position can grow a depletion layer 251 to arbitrarily define an area and a position of the tunneling area due to a purpose such as securing a predetermined coupling ratio or avoidance of the defect area of the tunnel insulating film 401.

Manufacturing step is simple since the depletion electrode 971 and the floating gate electrode 501 are both made from poly-crystalline silicone or the like which is widely used in manufacturing of a standard semiconductor device. Since the thickness of the depletion electrode insulating film 302 formed between the depletion electrode 971 and the floating gate electrode 501 is thicker than that of the gate insulating film 301, the depletion electrode insulating film 302 can hold a good condition without break or degradation if the maximum apply voltage is applied between the depletion electrode 971 and the floating gate electrode 501.

At least one of the tunnel insulating film 401, the control insulating film 601, and the depletion electrode insulating film 302 is made of a composite film of a silicon oxide film and a silicon nitride film to improve reliability.

As explained above in the embodiment according to the present invention prevention of concentration of the electric field to the edge area, where a defect grows, of the tunnel region 801, which gives a significant effect to the endurance characteristic and the retention characteristic, increase of the coupling ratio, and removal of a defect area are allowed. An electrically erasable and programmable nonvolatile semiconductor memory device having a high reliability realized by suppression of degradation in the tunnel insulating film can be obtained without increasing the occupation area 3. Third Embodiment The third embodiment of a nonvolatile semiconductor memory device is explained with references to FIGS. 7 to 9.

Figure 7:
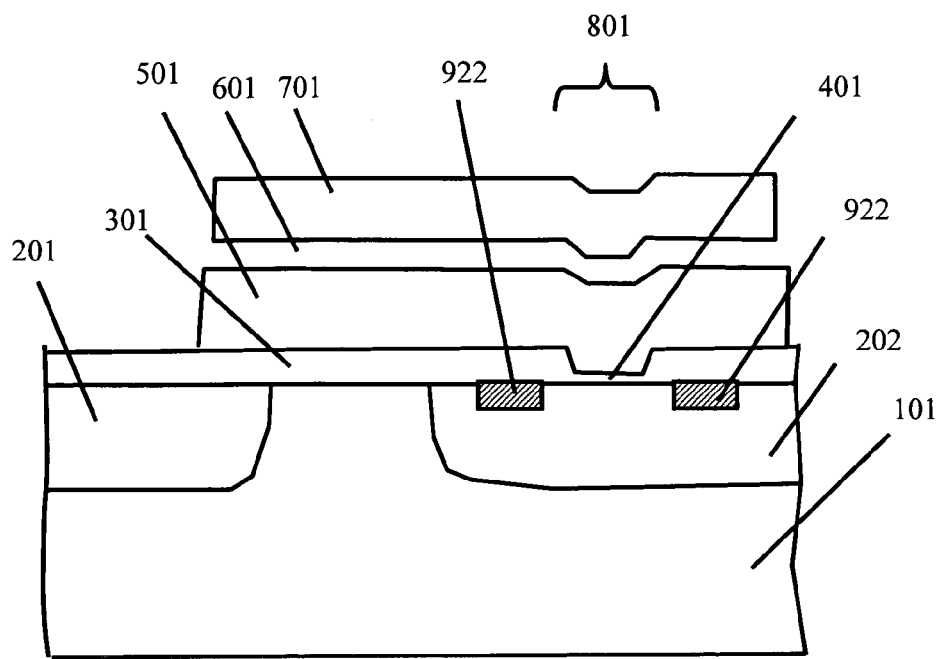
FIG. 7 shows a cross-sectional view illustrating the third embodiment of a nonvolatile semiconductor memory device according to the present invention.

FIG. 7 shows a cross-sectional view illustrating the third embodiment of a nonvolatile semiconductor memory device according to the present invention; a source region 201 and a drain region 202 of the second conductivity-type, which is N-type in this case, are formed apart to face each other on a surface of the semiconductor substrate of the first conductivity-type, which is P-type in this case, to define a channel region on the surface of the semiconductor substrate between the source region and the drain region; a floating gate electrode 501, which is formed from polycrystalline silicon or the like, is disposed on a gate insulating film 301, which is formed, for example, from silicon oxide film and having a thickness of 400 angstroms, over the source region, the drain region and the channel region; a control gate electrode 701, which is formed from polycrystalline silicon or the like, is disposed on a control insulating film, which is formed from a silicon oxide film, a silicon nitride film or a composite film of these films, over the floating gate electrode 501 to have a capacitive coupling with it. In particular a tunnel insulating film 401, which is formed from a silicon oxide film, a silicon nitride film, or a composite film of these films, is arranged on the surface of the tunnel region 801 in the drain region 202.

The floating gate electrode 501 is arranged on the tunnel insulating film 401. A high impurity concentration region 922 having P-type conductivity, whose potential is arbitrary given to generate a depletion layer in a part of the drain region 202 and the tunnel region 801, is placed around the tunnel region 801.

Figure 8:
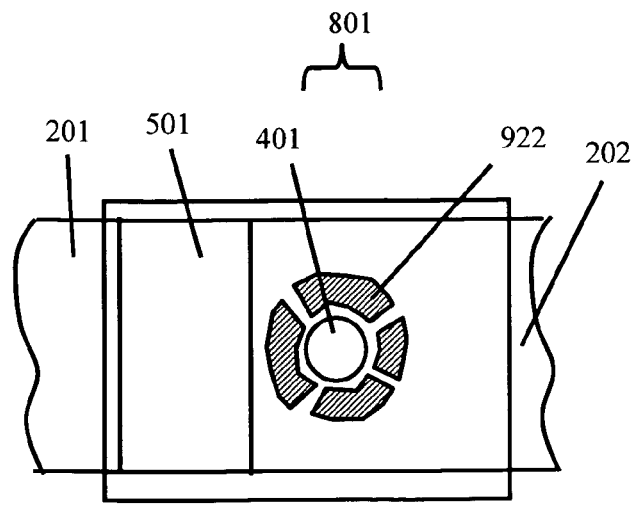
FIG. 8 shows a plan view illustrating the third embodiment of a nonvolatile semiconductor memory device according to the present invention.

FIG. 8 shows a plan view illustrating the third embodiment of a nonvolatile semiconductor memory device according to the present invention. The third embodiment shown by FIG. 7 is viewed plainly from the upside. The high impurity concentration region 922 is divided into four parts, and placed in the drain region 202 around the tunnel region 801 surrounding the tunnel insulating film 401. Each of the four parts of the high impurity concentration region 922 has an electrical connection to be applied with a mutually independent potential. Fixation of the high impurity concentration region 922 at a predetermined potential enables the formation of a depletion layer by depleting not only the drain region 202 locating under the high impurity concentration region 922 but also the tunnel region 801 locating under the tunnel insulating film 401. The depletion layer is formed according to the voltage applied to the high impurity concentration region 922. The applied voltage to the divided high impurity concentration region 922d can control the width and the depth of the depletion layer formed in the drain region 202 locating under the high impurity concentration region 922 and in the tunnel region 801 under the tunnel insulating film 401.

Since the impurity concentration of the high impurity concentration region 922 is not lower than 1019 atoms/cm3 and the impurity concentration of the tunnel region in the drain region is not higher than 1017 atoms/cm3, difference in the magnitude is more than one hundred; the depletion layer doesn't extend in the high impurity concentration region 922, almost all width of the depletion layer extends in the side of the drain region 202 and the tunnel region 801. Accordingly the voltage applied to the high impurity concentration region 922 works effectively in the formation and growth of the depletion layer in the side of the drain region 202 and the tunnel region 801.

Although FIG. 8 shows a case in which the high impurity concentration region 922 having P-type conductivity is divided into four parts, the number of division is not limited to four; formation of a unified single high impurity concentration region or division into more parts will also be possible.

Figure 9:
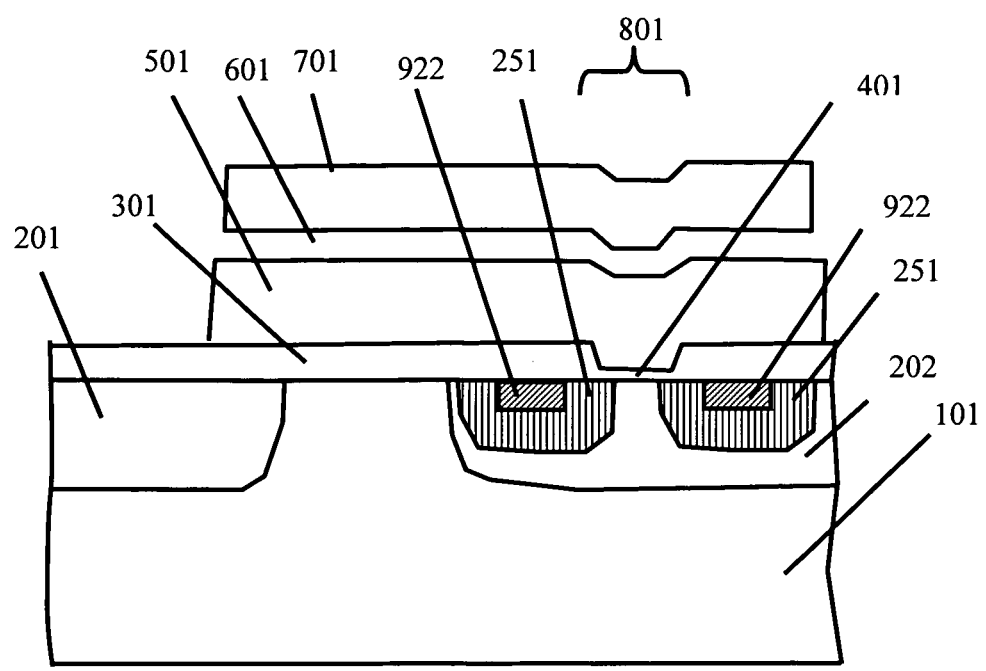
FIG. 9 shows a cross-sectional view illustrating a formation of the depletion layer in the third embodiment of a nonvolatile semiconductor memory device according to the present invention.

FIG. 9 shows a cross-sectional view illustrating a formation of the depletion layer in the third embodiment of a nonvolatile semiconductor memory device. A high voltage is applied to the high impurity concentration region 922; a depletion layer 251 is formed under the high impurity concentration region 922 and also formed under the tunnel insulating film 401 to narrow down the tunnel region 801.

Since the depletion layer 251 covers the edge area of the tunnel region 801 in the data rewriting operation, a strong electric field does not emerge between the floating gate electrode 501 and the drain region 202 at the edge area even a high voltage is applied between them. As a result an equivalent structure in which the thickness of the tunnel insulating film 401 is effectively increased is obtained; prevention of the concentration of the electric field at the edge area to which the stress is applied most, improvement of the reliability of the tunnel insulating film 401, and progress both in the number of data program/erase cycles and in the retention time are permitted.

Multiple arrangement of the high impurity concentration region 922 and assignment of independent potential to them enables arbitral control of the formation of the depletion layer 251 in the tunnel region 801, allowing reduction and arbitral placement of the tunneling area where electrons are essentially exchanged between the tunnel region 801 and the floating gate electrode 501 through the tunnel insulating film 401. Thereby not only avoiding the edge area of the tunnel region 801 as described above but also increase of the coupling ratio of the two capacitors: one formed between the floating gate electrode 501 and the control gate electrode 701, and the other formed between the floating gate electrode 501 and the drain region 202, is achieved by the reduction of the tunneling area, permitting reduction of the applied voltage needed for data rewrite operation.

In addition when a defect or the like occurs in the tunnel insulating film 401, removal of the area including the defect from the tunneling area is possible; a repairing function of the memory cell is provides.

In the embodiment shown by FIG. 9 the tunneling area is narrowed by the depletion layer 251 grown by the application of a high voltage to the high impurity concentration region 922 from both side of the tunnel region 801. The growth of the depletion lay 251 only from one side of the tunnel region 801 is also possible by applying a high voltage to a one side of the high impurity concentration region 922.

As shown above application of a predetermined voltage to the high impurity concentration region 922 at a needed position can grow a depletion layer 251 to arbitrarily define an area and a position of the tunneling area due to a purpose such as securing a predetermined coupling ratio or avoidance of the defect area of the tunnel insulating film 401.

At least one of the tunnel insulating film 401 and the control insulating film 601 is made of a composite film of a silicon oxide film and a silicon nitride film to improve reliability.

As explained above in the embodiment according to the present invention prevention of concentration of the electric field to the edge area, where a defect grows, of the tunnel region 801, which gives a significant effect to the endurance characteristic and the retention characteristic, increase of the coupling ratio, and removal of a defect area are allowed. An electrically erasable and programmable nonvolatile semiconductor memory device having a high reliability realized by suppression of degradation in the tunnel insulating film can be obtained without increasing the occupation area

What is claimed is:

1. an electrically erasable and programmable nonvolatile semiconductor memory device, comprising:
   a first conductivity-type semiconductor substrate;
   a second conductivity-type source region and a drain region disposed apart to face each other on a surface of the semiconductor substrate;
   a channel formation region sandwiched by the source region and the drain region, formed on the surface of the semiconductor substrate;
   a floating gate electrode disposed on a gate insulating film over the source region, the drain region and the channel region;
   a control gate electrode disposed on a control insulating film over the floating gate electrode and capacitively coupled to the floating gate electrode;
   a tunnel region disposed in a part of the drain region; and
   a tunnel insulating film disposed between a surface of the tunnel region and the floating gate electrode;
   wherein the tunnel region and a peripheral region around the tunnel region is made lower, and a depletion electrode, to which a predetermined potential is given to deplete a part of the tunnel region through a depletion electrode insulating film, is arranged in a lowered drain.

2. An electrically erasable and programmable nonvolatile semiconductor memory device according to claim 1; wherein the tunneling insulating film is disposed on a surface of the drain region, a surface of the tunnel region, and a surface of the peripheral region.

3. An electrically erasable and programmable nonvolatile semiconductor memory device according to claim 1; wherein the depletion electrode is divided into multiple parts and disposed around the tunnel region with the depletion electrode insulating film.

4. An electrically erasable and programmable nonvolatile semiconductor memory device according to claim 1; wherein the depletion electrode and the floating gate electrode are made from the same material.

5. An electrically erasable and programmable nonvolatile semiconductor memory device according to claim 1; wherein a thickness of the depletion electrode insulating film disposed between the depletion electrode and the tunnel region and disposed between the depletion electrode and the drain region is thicker than that of the gate insulating film.

* * * * *